United States Patent [19]

Aoshima et al.

[11] Patent Number: 4,967,144
[45] Date of Patent: Oct. 30, 1990

[54] ELECTRICAL SIGNAL OBSERVING DEVICE FOR CONVERTING AN ELECTRICAL SIGNAL TO BE MEASURED INTO AN OPTICAL INTENSITY WAVEFORM

[75] Inventors: Shinichiro Aoshima; Yutaka Tsuchiya, both of Shizuoka, Japan

[73] Assignee: Hamamatsu Photonics Kabushiki Kaisha, Shizuoka, Japan

[21] Appl. No.: 357,824

[22] Filed: May 26, 1989

[30] Foreign Application Priority Data

May 31, 1988 [JP] Japan .................. 63-133420

[51] Int. Cl.$^5$ .............................................. G01R 13/20
[52] U.S. Cl. .................................. 324/96; 324/121 R
[58] Field of Search ................. 324/96, 158 K, 121 R, 324/77 K; 455/611; 250/213 VT

[56] References Cited

U.S. PATENT DOCUMENTS

| | | | |
|---|---|---|---|
| H99 | 7/1988 | Lin ........................................ | 330/4.3 |
| 3,899,253 | 8/1975 | Overhoff ............................ | 356/355 |
| 4,147,977 | 4/1979 | Dimmock ........................ | 324/121 R |
| 4,446,425 | 5/1984 | Valdmanis et al. ............... | 324/77 K |
| 4,645,918 | 2/1987 | Tsuchiya et al. ............... | 250/213 VT |
| 4,694,154 | 9/1987 | Tsuchiya et al. ............. | 250/213 VT |
| 4,774,406 | 9/1988 | Chollet et al. ........................ | 324/96 |
| 4,836,633 | 6/1989 | Morgan et al. .................. | 350/96.18 |

FOREIGN PATENT DOCUMENTS 0197196 10/1986 European Pat. Off. .............. 324/96
0297562 1/1989 European Pat. Off. .............. 324/96

Primary Examiner—Gerard R. Strecker
Assistant Examiner—Edward Urban
Attorney, Agent, or Firm—Finnegan, Henderson, Farabow, Garrett and Dunner

[57] ABSTRACT

An electrical signal observing device has an optical signal as a probe for converting the voltage or current waveform to be measured into an optical intensity waveform. This optical intensity waveform is converted into a signal which can be used by a signal observation device. A continuous wave light source is used for generating an optical signal which is amplified by an optical amplifier having a gain controlled by the electrical signal to be measured. A photodetector detects light from the optical amplifier and generates an observation signal which is displayed by a display unit.

8 Claims, 6 Drawing Sheets

ELECTRICAL SIGNAL OBSERVING DEVICE FOR CONVERTING AN ELECTRICAL SIGNAL TO BE MEASURED INTO AN OPTICAL INTENSITY WAVEFORM

BACKGROUND OF THE INVENTION

This invention relates to electrical signal observing devices which have an optical signal as a probe, and convert the waveform of an electrical signal to be measured into an optical intensity waveform to obtain an observable signal.

Generally, repetitive high-speed electrical signals are measured with a sampling type oscilloscope (whose maximum resolution is 20 to 30 pico-seconds) and single phenomena are measured with a real time oscilloscope (whose maximum resolution is about 300 pico-seconds). However, the signals to be measured have increased in speed, and, consequently there is a demand for measurement of electrical signals with higher resolution.

One way to obtain higher resolution is illustrated by the voltage measuring device of U.S. Pat. No. 4,446,425. In this device, an optical modulator comprising a non-linear optical medium (Pockels cell), polarizer, analyzer and compensator is used to sample an electrical signal with a short pulse light beam. However, using the technique of sampling an electrical signal with a short pulse light beam is not applicable to the measurement of single event phenomena.

On the other hand, European Patent Application (OPI) No. 197196 (the term "OPI" as used herein means an "unexamined published application") discloses an electrically-electron optical oscilloscope in which, instead of a short pulse light beam, a continuous wave light beam (CW light beam) is employed.

The above-described conventional device employs an optical modulator including a non-linear optical medium such as a Pockels cell which is generally expensive, and difficult to handle. Furthermore, this conventional device needs a polarizer, analyzer and compensator in addition to the non-linear optical medium, and therefore its optical system is unavoidably complicated and its adjustment is intricate and troublesome. The optical modulator using the non-linear optical medium merely changes light transmittance using the change in light polarization, and does not have amplification capabilities. Therefore this device cannot effectively utilize the incident light and has a low S/N ratio.

SUMMARY OF THE INVENTION

An object of this invention is to eliminate the above-described difficulties accompanying a conventional electrical signal observing device. More specifically, an object of the invention is to provide an efficient electrical signal observing device which has a simple construction and uses an incident light beam effectively.

The foregoing object of the invention has been achieved by the provision of an electrical signal observing device in which, with an optical signal as a probe, the waveform of an electrical signal to be measured is converted into an optical intensity waveform to obtain an observable signal, which, according to the invention, comprises: a continuous wave light source for generating a continuous optical signal; an optical amplifier for amplifying the optical signal with a gain controlled by the electrical signal to be measured; a photodetector for detecting the emergent light beam of the optical amplifier at high speed, to obtain an observation signal; a trigger circuit for activating the photodetector in synchronization with the electrical signal to be measured; and a display unit for displaying the variation with time of an output of the photodetector.

In one aspect of the invention, the optical amplifier comprises a non-resonance traveling wave type optical amplifier in which reflection at both ends of a semiconductor laser is prevented.

In another aspect of the invention, a streak camera which serves as the photodetector and a plurality of identical optical amplifiers are employed, so that a plurality of electrical signals to be measured are observed, in a parallel mode, with the streak camera.

In still another aspect of the invention, the photodetector is a sampling type optical oscilloscope, and a light chopping element for turning on and off the optical signal with a predetermined frequency, and a lockin-in amplifier having a narrow band for detecting only the frequency component having the predetermined frequency from the output of the sampling type optical oscilloscope are provided.

In yet another aspect of the invention, the optical amplifier serves as the light chopping element.

In another aspect of the invention, at least one part of the incident and emergent optical systems of the optical amplifier and/or the incident optical system of the photodetector comprises an optical fiber.

To achieve the objects and in accordance with the purpose of the invention, as embodied and broadly described herein, the electrical signal observing device having an optical signal as a probe for converting the waveform of an electrical signal to be measured into an optical intensity waveform to obtain an observation signal, according to the invention comprises a light source for generating a continuous wave optical signal; optical amplifying means for amplifying the continuous wave optical signal with a gain controlled by the electrical signal to be measured; a photodetector operative when activated for generating an observation signal variable in time in accordance with the amplified optical signal of the optical amplifier; a trigger circuit for activating said photodetector in synchronization with the electrical signal to be measured; and a display unit for displaying the observation signal from the photodetector.

The accompanying drawings, which are incorporated in and constitute a part of this specification, illustrate one embodiment of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings.

Figure 1:
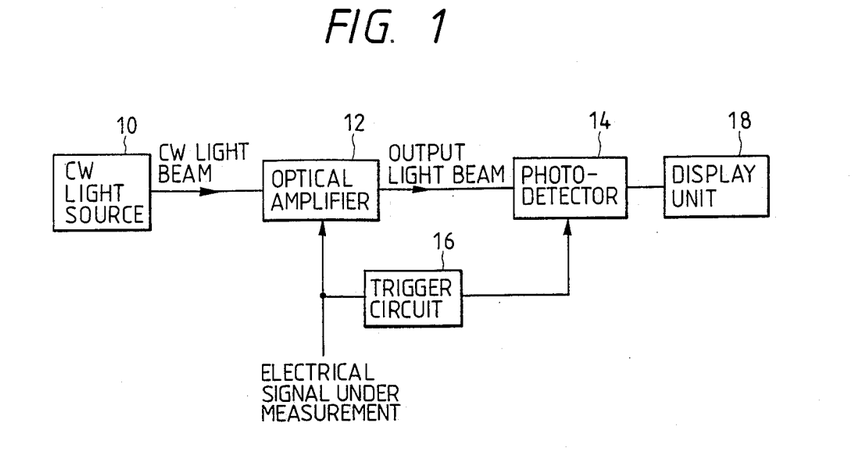
FIG. 1 is a block diagram showing the basic arrangement of an electrical signal observing device according to the invention.

In this invention, an optical signal is used as a probe, and the waveform of an electrical signal under measurement is converted into an optical intensity waveform to obtain an observation signal. As shown in FIG. 1, a continuous wave (CW) light source 10 produces a continuous light signal (CW light beam), and the CW light beam is modulated while being amplified with an optical amplifier 12 whose gain is controlled by the electrical signal under measurement. The output light beam of optical amplifier 12 is detected by a photodetector 14 at high speed and applied, as an observation signal, to a display unit 18. In this operation, a trigger circuit 16 activates photodetector 14 in synchronization with the electrical signal to be measured.

Therefore, the electrical signal observation device has no need for using a polarizer or analyzer. Since the electrical signal observation device does not require a polarizer or analyzer, it is simple in construction and low in manufacturing cost, and its optical system can be readily adjusted. Furthermore, since the optical signal is modulated by changing the amplification factor instead of the transmittance, the device can effectively utilize the incident light, thus the device is highly efficient and has a high S/N ratio.

Examples of the CW light source 10 are a He—Ne (helium neon) laser, semiconductor laser, and semiconductor-laser-excited solid laser.

The optical amplifier 12 that is capable of producing an optical output by amplifying input light by a factor that is dependent on an external electrical signal is available in various types including: a non-resonant traveling-wave type optical amplifier (TWA) which has an anti-reflection film coated on both end faces of a semiconductor laser to suppress reflection from those faces; a Fabry-Perot type optical amplifier (FPA) which uses a conventional semiconductor laser as an optical amplifier with it being biased below the threshold level for oscillation; an optical fiber Raman amplifier which utilizes Raman scattering induced in an optical fiber; an amplifier using a DFB laser; and an injection synchronous amplifier. Semiconductor amplifiers are advantageous because of their compactness and ease of control in operation.

Among semiconductor optical amplifiers, TWA and FPA are particularly advantageous. TWA has fast response to electrical signals and is capable of amplification of high speed optical signals. Because of the absence of resonator-dependent selectivity for wavelength, TWA has a broad (ca. 50 nm) wavelength range for gain and assures consistency in gain in the face of variation in the temperature of the amplifier or in the wavelength of incident light. TWA is also superior in terms of gain saturation and noise characteristic which are two important characteristics of an optical amplifier. On the other hand, FPA is easy to fabricate and allows a high gain to be attained in the neighborhood of a threshold value even with low current injection because it utilizes multiple reflections between both end faces to produce signal gain.

Another advantage of the semiconductor optical amplifiers is that their gain can be easily adjusted by changing the amount of injection current, so they can also be used as an optical switch by returning on or off the injection of current as in the present invention.

Figure 2:
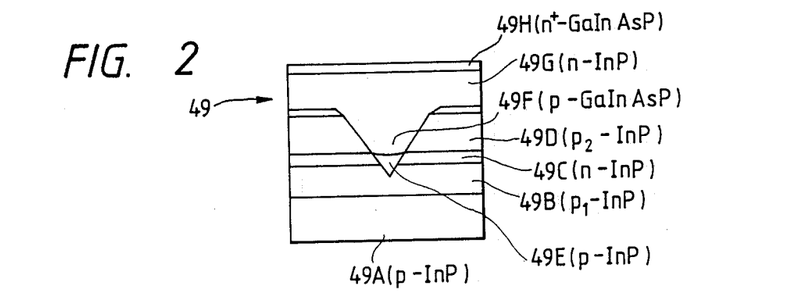
FIG. 2 is a sectional diagram showing one example of the structure of a semiconductor laser forming a traveling-wave type optical amplifier (TWA) which can be used as an optical amplifier in the invention.

A TWA that is suitable for use in the present amplifiers has an anti-reflection film coated on both end faces of a semiconductor laser 49 of the VIPS (V-grooved inner stripe of P-substrate) structure shown in FIG. 2 which may be formed by the following steps: in the first cycle of liquid-phase growth, a $p_1$-InP buffer layer 49B, n-InP block layer 49C and $P_2$-InP block layer 49D are grown on a p-InP substrate 49A; thereafter a V-shaped groove having a (111)B face is formed in 49B, 49C and 49D by wet etching, with a $SiO_2$ stripe mask being prepared by a conventional photolithographic process; and in the second cycle of liquid phase growth, a p-InP cladding layer 49E, p type or undoped GaInAsP active layer 49F, n-InP cladding layer 49G and N+-GaInAsP contact layer 49H are grown successively. The GaInAsP active layer 49F is formed at the bottom of the V-shaped groove, with its width and thickness being controlled to ca. 1.2 μm and 0.10 μm respectively. Thereafter, electrodes are formed and end faces are created by cleavage. An anti-reflection film is then deposited onto both end faces of the resulting semiconductor laser 49 using a material such as $SiO_2$ so as to fabricate a TWA. The semiconductor laser 49 of the VIPS structure has a sufficiently high efficiency of injection into the active layer to produce superior high output characteristics, so the TWA using this semiconductor laser also has high gain and high saturation energy.

Figure 3:
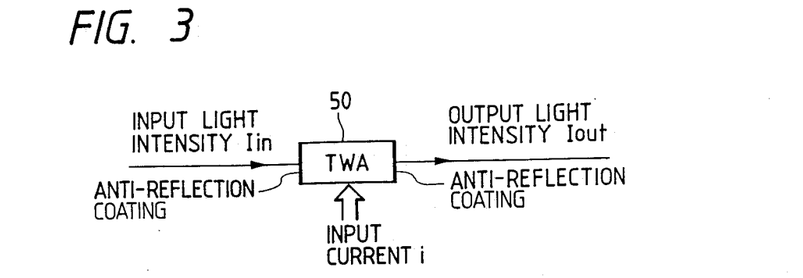
FIG. 3 is a block diagram illustrating the operating characteristic of the TWA of the invention.
Figure 4:
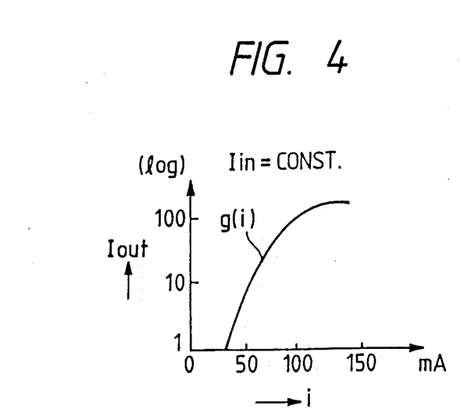
FIGS. 4 and 5 and are graphs of output optical intensity characteristics of the TWA of the invention.

The TWA 50 thus fabricated has a basic composition as shown in FIG. 3. When the intensity of input light $I_{in}$ being launched into the TWA 50 is constant, the intensity of output light $I_{out}$ from the TWA 50 will change as shown in FIG. 4 in response to the change in input current i. Accordingly, if the value of incident light Intensity $I_{in}$ is constant, output light intensity $I_{out}$ can be controlled by input current i.

Figure 5:
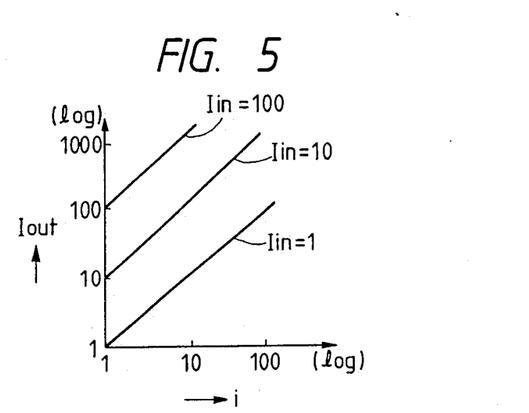

If, for simplification in description, it is assumed that only the linear part of characteristic curve g(i) is used, then a graphical representation as shown in FIG. 5 can be obtained from that of FIG. 4. Accordingly, the TWA can be used as a linear amplifier in the range illustrated in FIG. 5.

Figure 6:
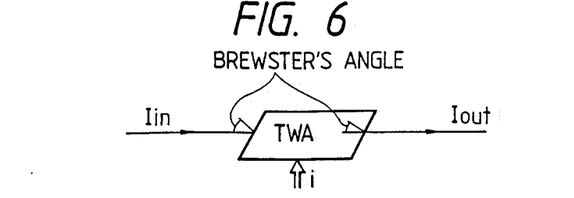
FIGS. 6, 7, 8, 9 and 10 are diagrams showing various modifications of the TWA according to the invention.

In the TWA 50, reflection from both end faces is suppressed by the anti-reflection film coated thereon. It should, however, be noted that the anti-reflection film is not the sole mechanism for suppressing reflection from both end faces of the semiconductor laser and the same results can be attained by cutting each of the end faces at an angle equal to the Brewster's angle as shown in FIG. 6. In this case, the plane of polarization is restricted. However, this restriction may be an advantage in that any polarizer or analyzer is unnecessary when a need arises for restricting the plane of polarization.

Figure 7:
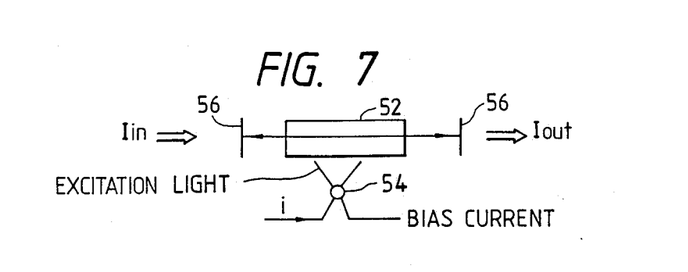
Figure 8:
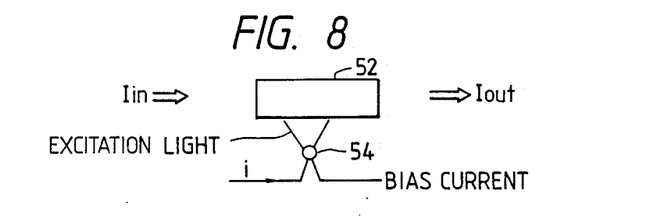

Besides the TWA 50 and FPA described above, other types of optical amplifiers can be used in the present invention, including the resonant optical amplifier shown in FIG. 7 which is biased to a level just below the threshold for oscillation by imparting excitation light to a solid laser medium 52 with a laser diode 54, and the non-resonant optical amplifier shown in FIG. 8 that is similar to TWA in which reflection from both end faces of the solid laser medium 52 is suppressed by providing an anti-reflection film or adjusting the angle of each end face to be equal to the Brewster's angle. In FIG. 7, the numeral 56 designates a resonant mirror. The laser diode 54 may or may not be supplied with a bias current for attaining a value in the neighborhood of the threshold level.

Figure 9:
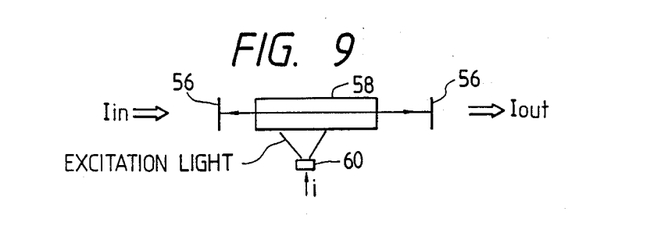

Another type of optical amplifier 12 that can be used in the present invention is shown in FIG. 9, in which a dye or gas laser medium 58 is excited with light from a light-emitting diode, a laser diode, various types of current control led lamps 60 or the like. Resonant mirrors 56 may be omitted from the system shown FIG. 9.

Figure 10:
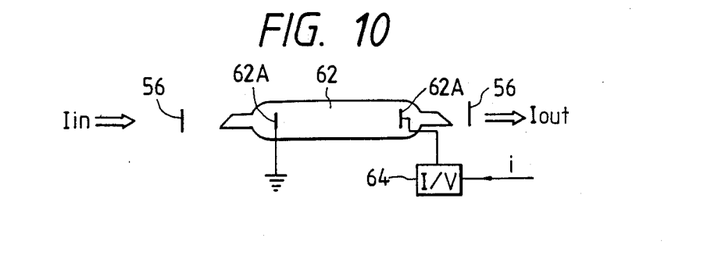

Another type of an optical amplifier 12 is shown in FIG. 10. In the optical amplifier of FIG. 10, a gas laser medium 62 is excited when a voltage is applied across electrodes 62A through a current-to-voltage converter 64. That is, electrical discharge is utilized to excite the laser medium. In this case also, the optical amplifier shown in FIG. 10 may be used without resonance mirrors 56.

Optical fibers may be used in the incident and emergent optical system of optical amplifier 12 and/or in at least one part of the incident optical system of photodetector 14. When the optical fibers are used, severe adjustment of the optical system is unnecessary, and there is greater freedom in arrangement of the components. These advantages of optical fibers permit the device to be miniaturized.

If photodetector 14 is a streak camera, and a plurality of optical amplifiers 12 are employed, a plurality of electrical signals can be observed, in a parallel mode, with the streak camera.

The above-described optical detector 14 may be an electro-optical sampling type optical oscilloscope. The optical detector is further combined with a light chopping element for turning on and off a light signal under measurement at a predetermined frequency, and with a lock-in amplifier that takes only the frequency component out of the output of the photodetector 14, then lock-in detection is performed. As a result, in addition to the above-described effects, an increased S/N is obtained.

The above-described light chopping element may be provided as: an ordinary light chopper, the above-described optical amplifier, an light modulator using an electro-optical effect, an A-O modulator, an optical Kerr shutter, a liquid crystal shutter or the like. When the light chopping element is the optical amplifier which has a gain, then the utility factor of light can be increased.

In the case where the above-described optical amplifier 12 is so designed as to operate as the light chopping element, it is unnecessary to provide another light chopping element. As a result, the arrangement of the streak camera is simplified.

The preferred embodiments of this invention will be described hereinafter with reference to the accompanying drawings.

Figure 11:
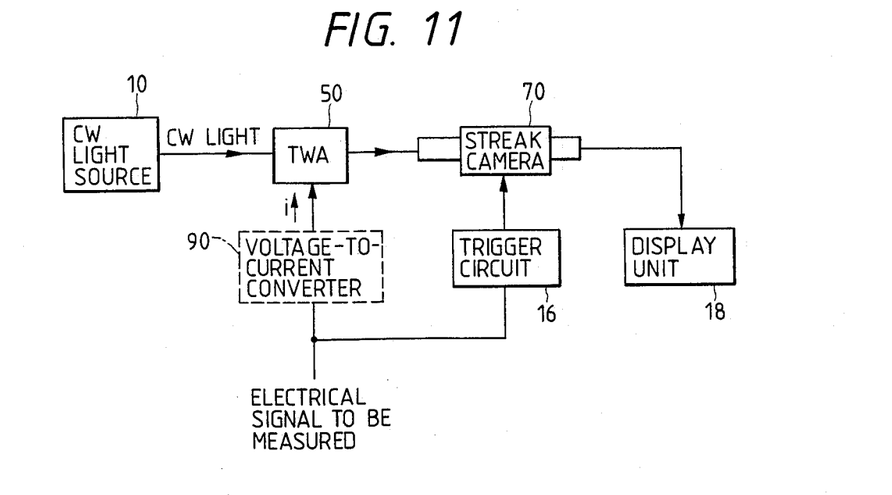
FIG. 11 is a block diagram showing the arrangement of a first preferred embodiment of the electrical signal observing device according to the invention.

A first preferred embodiment of the invention is designed as follows: in an electrical signal observing device as shown in FIG. 11 (comprising CW light source 10, optical amplifier 12, photodetector 14, trigger circuit 16 and display unit 18), the above-described TWA 50 is used as optical amplifier 12 and a streak camera 70 (FIG. 2) is used as photodetector 14 so that an observation signal is displayed on display unit 18.

Figure 12:
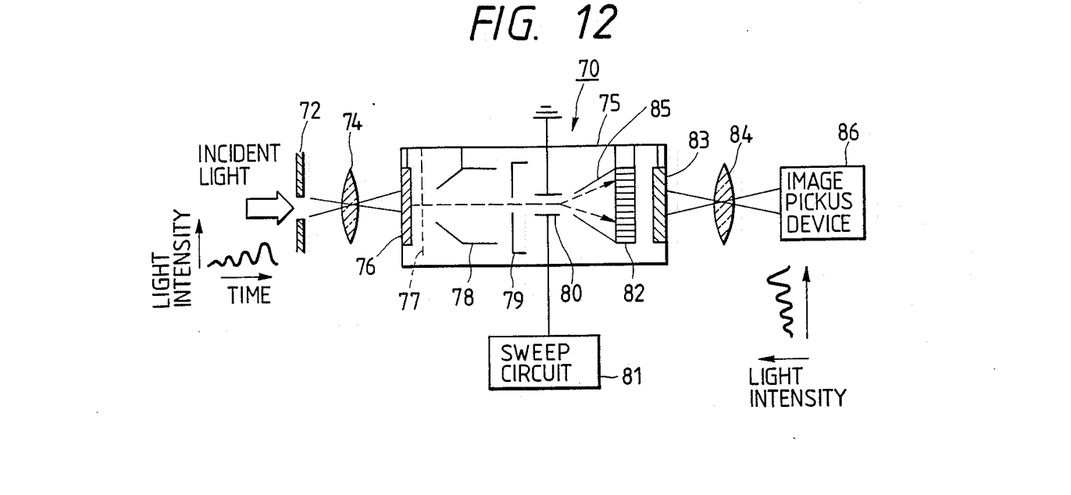
FIG. 12 is a sectional view showing the arrangement of a streak camera employed in the electrical signal observing device shown in FIG. 11.

Streak camera 70, as shown in FIG. 12, comprises: a streak tube 75, and an image pick-up device 86 such as a SIT camera or CCD camera for detecting a streak image through lens 84 in the emergent optical system. Streak tube 75 comprises: a photocathode 76 for converting into an electron image a light beam (slit image) which is applied and image-formed through a slit 72 and a lens 74 in its incident optical system; a mesh-type accelerating electrode 77 for accelerating the electron image formed by photocathode 76; deflecting electrodes 80 for deflecting in a direction perpendicular to the longitudinal direction of the slit 72 (which is vertical in FIG. 12), in a sweep mode, the electrons accelerated by accelerating electrode 77; and a phosphor screen 83 for converting the electron image thus deflected by the deflecting electrodes 80 into the optical image. The optical image is a streak image which is a luminance data image with time plotted on the vertical axis.

Further in FIG. 12, streak camera 70 includes a focusing electrode 78 for focusing the electrons accelerated by accelerating electrode 77 in a predetermined range; an aperture electrode (anode) 79 for further accelerating the electrons; a sweep circuit 81 for applying a predetermined sweep voltage across the deflecting electrodes 80 in synchronization with the passage of electrons; a microchannel plate (MCP) 82 in front of phosphor screen 83 for increasing the number of electrons passed through deflecting electrodes 80; and a conical shielding electrode 85 provided on the input side of phosphor screen 83 for blocking the electrons deflected out of the effective sweep area of phosphor screen 83 in order to improve the accuracy of measurement.

The operation of the first embodiment of this invention will be described with reference to FIG. 11.

The CW light source 10 applies a CW light beam to TWA 50. An electrical signal under measurement is applied, as a gain control signal, to TWA 50, through voltage-to-current converter 90 then TWA 50 applies the CW light beam modulated with the electrical signal to streak camera 70. Therefore, when streak camera 70 is synchronized with the electrical signal under measurement by using a trigger signal outputted by trigger circuit 16, an observation signal corresponding to the electric signal under measurement is applied to image pickup device 86 in streak camera 70.

When the electrical signal under measurement is a current signal, voltage-to-current converter 90 may be eliminated.

In the above-described embodiment, streak camera 70 is employed as the photodetector. Therefore, with the device, a single phenomenon can be observed.

A second preferred embodiment of the invention will be described with reference to FIG. 13.

Figure 13:
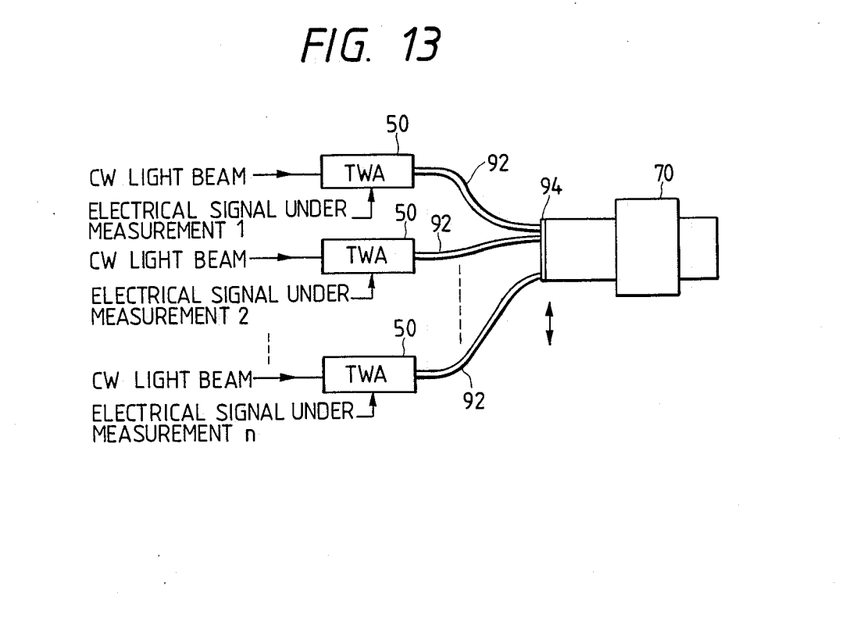
FIG. 13 is a block diagram showing the arrangement of a second preferred embodiment of the electrical signal observing device according to the invention.
Figure 14:
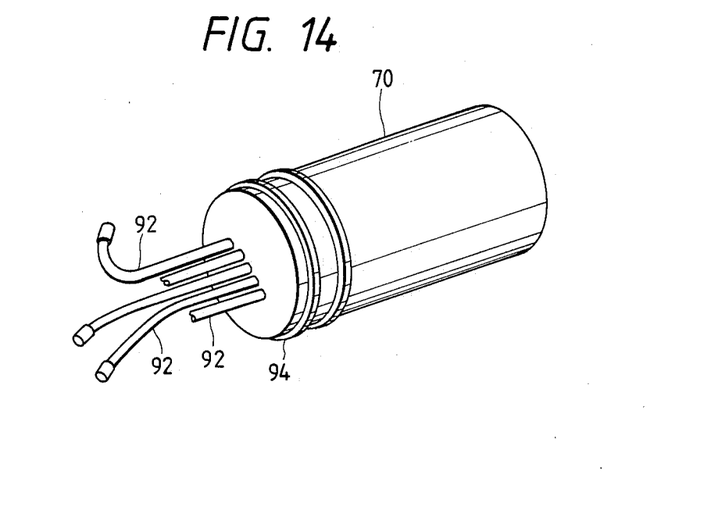
FIG. 14 is a perspective view showing a fiber plate employed in the preferred embodiment shown in FIG. 13.

The second embodiment, illustrated in FIG. 13, is designed as follows: instead of a single TWA 50 as shown in FIG. 11, a plurality of TWAs 50 are provided, and the emergent light beams of TWAs 50 are applied to streak camera 70 through a plurality of optical fibers 92 (as shown in FIG. 14) connected to a fiber plate 94 in such a manner that they are arranged in a line in parallel with the slit 72.

In the second preferred embodiment, fluorescence is produced in a line on phosphor screen 83 corresponding to electrical signals to be measured. That is, with the preferred embodiment of FIG. 13, a plurality of electrical signals can be observed in a parallel mode. In this case, multiple electrical signals to be measured can be simultaneously detected when they are simultaneously generated. On the other hand, when the multiple electrical signals to be measured are generated at different timings, respectively, they can be simultaneously detected by beforehand adjusting the lengths of respective wires along which the electrical signals propagate and matching the timings for applying the respective electrical signals to the respective TWAs.

Further, when the timing for producing the electrical signals to be measured is known, by adjusting the lengths of the optical fibers there can be provided an electrical signal observing device, which can be exclusively used in accordance with its application and in which the multiple electrical signals generated at different timings can be simultaneously detected.

Still further, the optical fibers are designed so that the lengths thereof are differentiated from one another by a constant amount corresponding to the observable time(T) of the streak camera, so that when a single electrical signal to be measured is applied to TWAs, the single electrical signal to be measured is detected over a long time with one scanning operation. For example, in a case of using n fibers, detection of the electrical signal to be measured can be performed for a period (nT) with one scanning operation.

Figure 15:
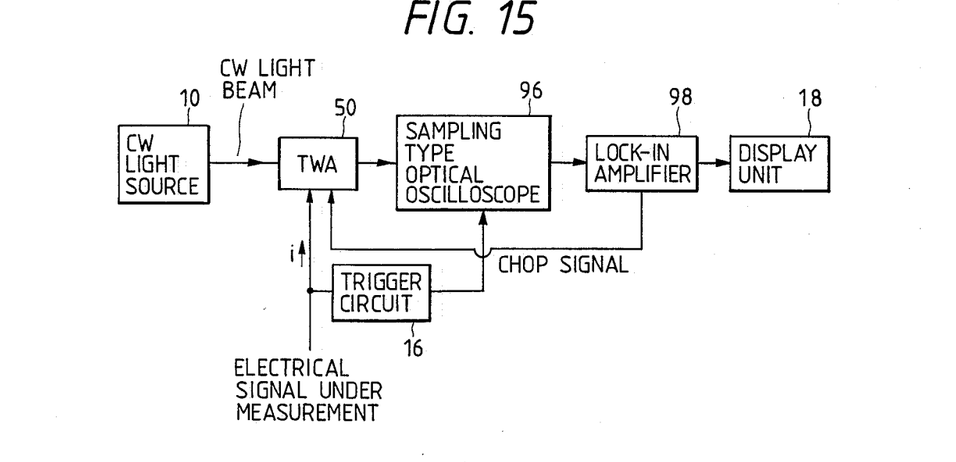
FIG. 15 is a block diagram showing a third preferred embodiment of the electrical signal observing device according to the invention.

A third embodiment of the invention will be described with reference to FIG. 15.

This embodiment is designed as follows: in the electrical signal observing device as shown in FIG. 1 (comprising the CW light source 10, and the display unit 18), the above-described TWA 50 is used as optical amplifier 12 and a sampling type optical oscilloscope 96 is used as photodetector 14. Lock in amplifier 98 is employed to detect only a predetermined frequency component from the output of sampling type optical oscilloscope 96, so that TWA 50 is turned on and off with the predetermined frequency of lock-in amplifier 98.

Figure 16:
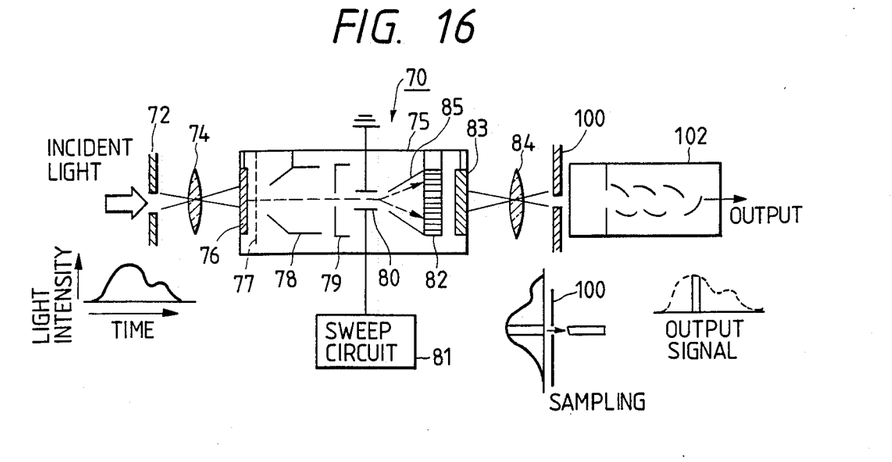
FIG. 16 is a sectional diagram showing the arrangement of a sampling type optical oscilloscope employed in the electrical signal observing device shown in FIG. 15.

In sampling type optical oscilloscope 96, as shown in FIG. 16, a slit board 100 to spatially limit a streak image is provided to streak camera 70 (shown in FIG. 12) to perform an optical sampling operation. The fluorescence produced by phosphor screen 83, after being controlled by slit board 100, is converted into an electrical signal by a zero-dimensional photodetector such as photomultiplier 102.

In the third embodiment of the invention, a sampling type optical oscilloscope 96 is employed as photodetector 14, the electrical signal observing device can be manufactured at low cost, and can measure electrical signals with ease. Furthermore, the employment of lock-in amplifier 98 contributes to an improved S/N ratio.

Furthermore, in the third embodiment, TWA 50 is used as the lock-in detecting light chopping element. Therefore, the electrical signal observing device is simple in construction.

Still furthermore, in the sampling type optical oscilloscope, slit board 100 is not necessarily disposed just in front of photodetector 102. For example, slit board 100 may be disposed within streak tube 75 as disclosed in U.S. Pat. Nos. 4,694,154 or 4,645,918.

Figure 17:
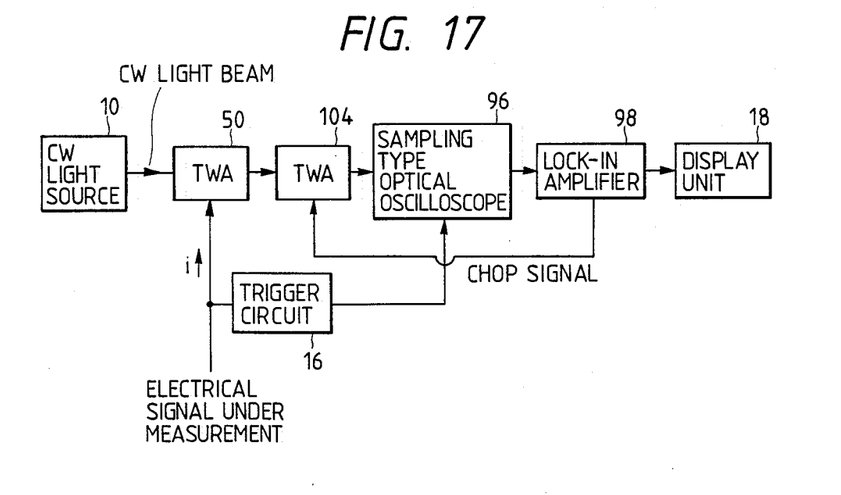
FIG. 17 is a block diagram showing the arrangement of a fourth preferred embodiment of the electrical signal observing device according to the invention.

A fourth embodiment of the invention will be described in detail with reference to FIG. 17.

This embodiment of the invention is designed as follows: in the electrical signal observing device as shown in FIG. 16, in addition to TWA 50, another TWA 104 is provided as a lock-in detecting light chopping element. also, TWAs 50 and 104 which serve as optical amplifiers are arranged in tandem to improve the amplification factor.

TWAs 50 and 104 may be given increased mechanical strength and vibration resistance, for instance, by securing their respective end faces together.

TWA 50 and TWA 104 may be replaced with each other in position.

In the above-described embodiments, a part of an electrical signal under measurement is applied directly to TWA 50; however, if necessary, the electrical signal may be applied to TWA 50 after being amplified by a wide band amplifier with the waveform maintained unchanged. In addition, in the case where the electrical signal to be measured is a voltage signal, it may be applied through a voltage-to-current converter to TWA 50.

In the first and second embodiments as shown in FIGS. 11 and 13, a synchroscan streak camera as disclosed in SPIE Proc. vol. 348, pp. 245-250 (1982) may be used as streak camera 70. Further, in the third and fourth embodiments as shown in FIGS. 15 and 17, a synchroscan photometer as disclosed in SPIE Proc. vol. 491, pp. 224-229 (1984) may be used as sampling type optical oscilloscope.

It will be apparent to those skilled in the art that various modifications and variations can be made in the electrical signal observing device of the present invention without departing from the scope or spirit of the invention. Thus, it is intended that the present invention cover the modifications and variations of this invention provided they come within the scope of the appended claims and their equivalents.

What is claimed is:

1. An electrical signal observing device having an optical signal as a probe for converting the waveform of an electrical signal to be measured into an optical intensity waveform to obtain an observation signal, comprising:

a light source for generating a continuous wave optical signal;
   optical amplifying means for amplifying said optical signal with a gain controlled by the electrical signal to be measured;
   a photodetector operative when activated for detecting said amplified optical signal and generating an observation signal;
   a trigger circuit for activating said photodetector in synchronization with the electrical signal to be measured; and
   a display unit for displaying the observation signal from said photodetector.

2. An electrical signal observing device as claimed in claim 1, wherein said optical amplifier comprises a non-resonance traveling wave type optical amplifier including a semiconductor laser whose both ends have anti-reflection coatings.

3. An electrical signal observing device as claimed in claim 1, wherein said optical amplifying means includes a plurality of identical optical amplifiers and wherein said photodetector comprises a streak camera responsive to the amplified optical signals from said plurality of optical amplifiers for observing the observation signals in a parallel mode.

4. An electrical signal observing device as claimed in claim 1, wherein said photodetector comprises a sampling type optical oscilloscope for generating an observation signal and wherein said electrical signal observing device further includes a light chopping element for turning on and off said optical signal with a predetermined frequency; and a lock-in amplifier having a narrow band width for detecting and amplifying said predetermined frequency component from the output of said sampling type optical oscilloscope.

5. An electrical signal observing device as claimed in claim 4, wherein said optical amplifying means has the function of a light chopping element.

6. An electrical signal observing device as claimed in claim 4, including two traveling-wave type optical amplifiers connected to each other in series, one serving as said optical amplifying means and the other serving as said light chopping element.

7. An electrical signal observing device as claimed in claim 1, including optical fibers for transmitting cw optical signals from said light source to an input of said optical amplifying means and/or including optical fibers for transmitting amplified optical signals from said optical amplifier to an input of said photodetector.

8. An electrical signal observing device as claimed in claim 1, wherein said photodetector comprises a streak camera.

* * * * *